(12) United States Patent
Prunk et al.

(10) Patent No.: US 7,129,711 B2
(45) Date of Patent: Oct. 31, 2006

(54) DEVICE FOR DETECTING INTERFERENCES OR INTERRUPTIONS OF THE INNER FIELDS SMOOTHING LAYER OF MEDIUM OR HIGH VOLTAGE CABLES

(75) Inventors: Harry Prunk, Ganderkesee (DE); Klaus Bremer, Grasberg (DE)

(73) Assignee: Sikora AG, Bremen (DE)

( * ) Notice: Subject to any disclaimer, the term of this patent is extended or adjusted under 35 U.S.C. 154(b) by 0 days.

(21) Appl. No.: 11/080,178

(22) Filed: Mar. 15, 2005

(65) Prior Publication Data
US 2005/0218905 A1   Oct. 6, 2005

(30) Foreign Application Priority Data
Mar. 18, 2004  (DE)  ............... 10 2004 013 606

(51) Int. Cl.
*G01R 31/02* (2006.01)
(52) U.S. Cl. .................. 324/543; 324/539; 324/541
(58) Field of Classification Search ............... 324/539, 324/541, 543
See application file for complete search history.

(56) References Cited

U.S. PATENT DOCUMENTS

| | | | |
|---|---|---|---|
| 4,301,399 A * | 11/1981 | Miller et al. ............... 324/541 |
| 4,980,645 A * | 12/1990 | Soma et al. ............... 324/541 |
| 6,353,993 B1 * | 3/2002 | Schrader ............... 29/564.4 |
| 6,498,499 B1 * | 12/2002 | Sikora ............... 324/661 |
| 6,836,124 B1 * | 12/2004 | Fleming et al. ............... 324/519 |

FOREIGN PATENT DOCUMENTS

| | | | |
|---|---|---|---|
| DE | 4412122 | 10/1995 | |
| DE | 19809890 | 11/1999 | |
| EP | 0394525 | 10/1990 | |
| GB | 2003613 | 9/1978 | |
| JP | 04032783 A * | 2/1992 | ............... 324/543 |
| JP | 05240905 A * | 9/1993 | ............... 324/543 |

* cited by examiner

*Primary Examiner*—Anjan Deb
*Assistant Examiner*—John Zhu
(74) *Attorney, Agent, or Firm*—Vidas, Arrett & Steinkraus

(57) ABSTRACT

A device for controlling the manufacture of a medium or high voltage cable in particular of the inner and outer semi-conducting layers. For control purposes the current or capacitance is measured by a measuring electrode encircling the cable and connected to a high frequency source. Equipotential electrodes join the measuring electrodes on both sides.

9 Claims, 5 Drawing Sheets

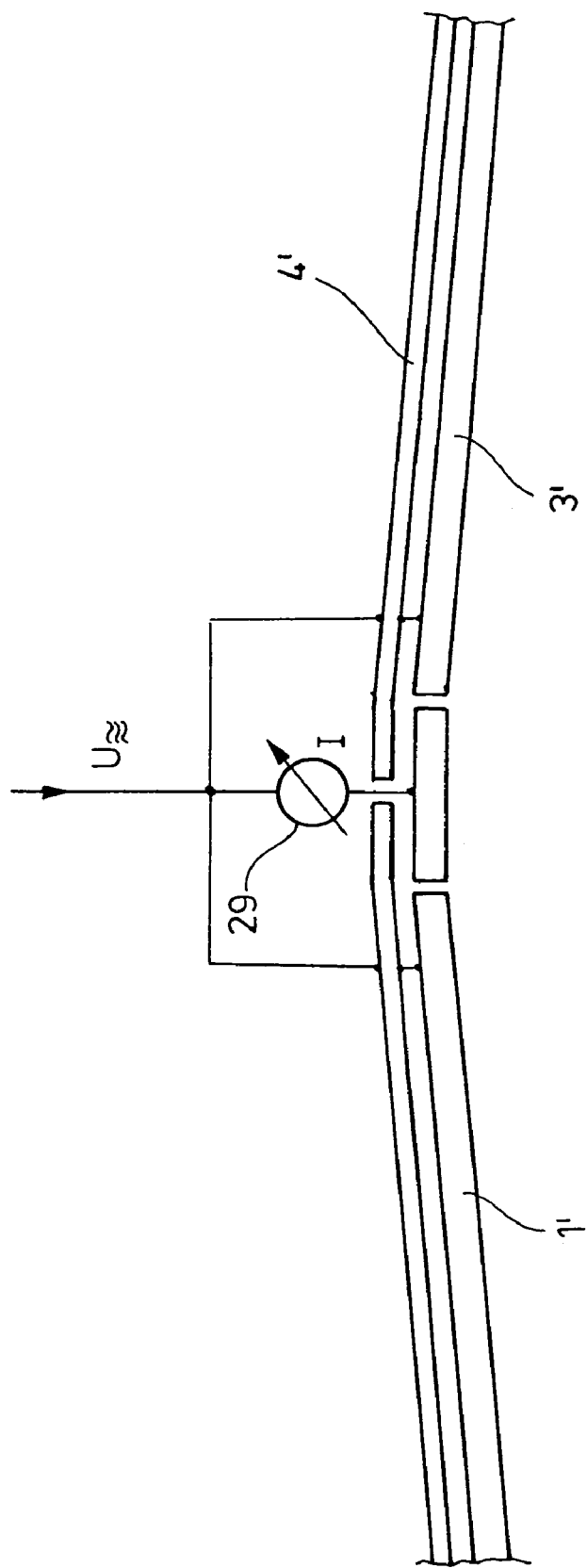

DEVICE FOR DETECTING INTERFERENCES OR INTERRUPTIONS OF THE INNER FIELDS SMOOTHING LAYER OF MEDIUM OR HIGH VOLTAGE CABLES

CROSS-REFERENCE TO RELATED APPLICATIONS

Not applicable.

STATEMENT REGARDING FEDERALLY SPONSORED RESEARCH

Not applicable.

BACKGROUND OF THE INVENTION

The principle structure of a medium or high voltage cable with an envelope of plastic material is such that the conductor which usually is consisting of a plurality of wires is encircled by a field controlling or field smoothing layer. This layer is encircled by an insulation layer of plastic material of more or less thickness. The insulation layer is encircled by an outer semiconductor layer. The semiconductor layers are relatively thin if compared with the insulation layer and are also of plastic material. For conducting purposes these layers are added with graphite in order to achieve a weak conducting property. The purpose of these semiconductor layers is to influence the electric field strength within the insulation layer.

The envelope consisting of the individual layers is usually applied to the conductor by an extrusion process by means of a suitable extrusion head. A cross-linking path joins to the extruder wherein the plastic material is cross-linked. A plurality of inspection and controlling devices are known in order to inspect the desired properties and qualities of a cable. An important criterion is the diameter of a cable. A plurality of proposals have been made for measuring the diameter which normally base on optical measuring methods. A further criterion is the position of the conductor within the envelope. Eccentricities result in a reduction of the thickness of the insulation to one side and therefore include the danger of a breakthrough. In DE 44 12 122 C1 a method for measuring the eccentricity of a conductor within an insulation of a cable has been disclosed. Furthermore, it is known to measure the wall thickness of the cable insulation. In this method the difference between the outer diameter of the conductor and the outer diameter of the insulation is measured.

In order to measure the wall thickness and also the diameter, in particular for an envelope consisting of a plurality of layers it has become known to direct x-rays to the cable and to project the shadows on a x-ray receiver. This known methods also allow to determine the thickness of the inner field smoothing layer and of the outer semiconductor layer. It has been also become known to provide two measuring paths orthogonal to each other (XY-axes).

The described manufacture for high voltage cables does not exclude that interferences or interruptions for the inner field smoothing layer occur. In this case the field strength in the insulation is increased at the interruptions so that a breakthrough may occur. By means of the described x-ray method short interruptions of the field smoothing layer cannot be detected, in particular if they are beyond the measuring paths.

From EP 0 394 525 A1 it has become known to move a cable through at least two annular probes arranged one after the other. The probes each form capacitances with the conductor and are loaded by a voltage source such that upon failures in the insulation the capacity is short circuited by a breakthrough current. This method allows to detect failures of the insulation and also of their position thereof. Disturbances or interruptions in the inner field smoothing layer cannot be detected by the known method. The contribution of this layer to the total insulation for the cable sheath is neglectable. In the known method, no breakthrough would occur if the outer semiconductor layer or the inner field controlling layer is interrupted in a certain area.

Apparatuses or methods which allow by simple means to reliably detect interruptions or interferences of the mentioned layers for medium and high voltage cables are not known.

For cables which serve for the transmission of signals or for low voltage applications, it has become known by GB 2 003 613 A to measure the specific capacitance. The cable which normally has only one insulation layer is moved through a measuring tube filled with water. A high frequent measuring voltage is connected to the tube. The current which flows between the measuring tube and the conductor is depending upon the dielectricity of the insulation material as well as upon the thickness in connection with the outer diameter. For the manufacture of such cables, the maintenance of the predetermined specific capacitance (capacitance per length unit) is important since the magnitude of the capacitance in conjunction with the inductance defines the characteristic impedance of the cable. The user of the cable must consider a specific characteristic impedance. From DE 198 09 890 C1 it has become known to provide in the cooling path of an extrusion plant a first measuring electrode for the measuring of the specific capacitance and a second measuring electrode having a smaller length than the first measuring electrode. The current between the first and the second electrode on one side and the conductor on the other side is measured. The second measuring electrode has the purpose to measure changes of a capacitance occurring temporarily. If such temporary capacitance changes occur periodically, this results in reflections for the data transmission and high frequency cables and thus in losses at the discrete transmission frequencies. Thus, a so-called "structural return loss" occurs which apparently should be as small as necessary.

In connection with medium and high voltage cables, the capacitance is not measured since the knowledge thereof is not necessary for the operation of the cables.

The invention relies on the problem to provide a device by which in a simple manner interferences and interruptions of the inner field controlling and/or the outer semiconductor layer for medium and high voltage cables can be detected.

BRIEF SUMMARY OF THE INVENTION

In accordance with the invention, a medium or high voltage cable is moved through a metallic cylinder filled with water. The metallic cylinder has a relatively small length and is connected to a high frequency voltage source. The frequency for example is 20 kHz. A measuring device measures the current flowing between the cylindrical electrode and the cable conductor connected with earth and generates a signal if the current e.g. upon an interruption of the field controlling layer is below a predetermined range or deviates from a predetermined threshold. Preferably, the mean value of the current is determined and thereafter deviations from the mean value are detected. If the deviation exceeds a predetermined amount, a failure signal is generated. The magnitude of the current results from the capacitance between the measuring electrode and the conductor of the cable. Therefore, also the capacitance can be measured and compared with a predetermined threshold.

Cylindrical equipotential electrodes of metallic material are located at both ends of the measuring electrode. The length of the equipotential electrodes is a multiple of the length of the measuring electrode e.g. up to 50 times larger. The equipotential electrodes are on the same or a higher potential as or than the measuring electrode.

As known, the capacitance of a co-axial cable can be determined as follows:

$$C = \frac{2\pi \cdot \varepsilon_0 \cdot \varepsilon_r \cdot l}{\ln R/r}$$

or as quantity equation for the capacitance in pF per meter:

$$C' = \frac{55.63 \cdot \varepsilon_r}{\ln R/r}$$

wherein R is the outer diameter of the insulation of the cable and r the outer diameter of the conductor.

The invention relies on the recognition that the semiconducting layers having a specific conductivity, can be regarded as conductors for the capacity measurement and that therefore the capacity of a medium or high voltage cable is essentially determined by the insulation material and its geometric sizes.

It has to be considered that the specific resistance ρ in 'Ωcm of the outer semiconductor is remarkably smaller than the specific resistance ρ in 'Ωcm of water. This has the result that the equipotential electrodes have a position and a dimension or have to be loaded with a potential such that the flux lines in the direct area of the measuring electrode are radial or are concentrated towards the conductor (focussing effect). In the outer semiconductor layer in the area of the measuring electrode no potential differences must occur which otherwise would cause a flow of current in longitudinal direction.

For the above the capacity is determined by:

$$C_1 = \frac{55.63 \cdot \varepsilon_r}{\ln R/r_1}$$

wherein

R=outer radius of the insulation (without outer semiconductor layer) and $R_1$=the inner radius of the insulation (conductor+inner semiconductor layer).

In case of an interference of the inner semiconductor layer $r_1$ becomes $r_2$, i.e. the radius of the conductor since this interruption is filled up with insulation material during production. The outer radius R practically is not influenced by this occurrence. Thus, in this case the capacitance value $C_2$ is $$C_2 = \frac{55.63 \cdot \varepsilon_r}{\ln R/r_2}$$

as long as the semiconductor layer is not existent.

While known devices for the measurement of capacitances have screening electrodes which have the same length as the measuring electrode, it is preferred in the invention that the proportion of the length of the equipotential electrodes to the measuring electrode is approximately 10:1 to 50:1 in order to achieve a radial or concentrated flux line arrangement between the measuring electrode and the conductor or the smoothing layer. This considers that the conductivity of the outer semiconductor layer is 10 times larger than that of water.

If the equipotential electrodes do not have sufficient length, the electric field of the measuring electrode regarded in longitudinal direction of the cable would be expanded by the outer semiconductor. Temporary interruptions of the smoothing layer could not be recognized.

The length of the equipotential electrodes define to which amount a radial homogeneous electric field is achieved in the area of the measuring electrode. It is conceivable instead of a homogeneous electric field to establish a field with a larger density of the flux lines in the centre area of the measuring electrode which practically means a focussing of the flux lines towards the conductor. By means of such a measure the length of the equipotential electrodes could be reduced. To achieve such a focussing effect or to avoid inhomogeneous electric field, it is advantageous if for example the measuring electrode has a larger diameter than the equipotential electrodes. An additional focussing or at least compensating effect can be achieved if the electric potential of the equipotential electrodes is higher than that for the measuring electrode. Finally, it can be conceived to form the equipotential electrodes concave or conical, with the larger diameter thereof being adjacent to the measuring electrode. Also in this manner a focussing effect is achieved.

According to a further embodiment of the invention, the measurement of interruptions or interferences is coupled with a length signal of a length measuring device in order to identify the position of the interference on the cable. Length measuring devices e.g. by means of pulse generators are known since a long time.

Since the capacitance changes with the outer diameter of the insulation and since during production of the cable the diameter may change, it is provided according to a further embodiment of the invention to measure the outer diameter and to determine changes with respect to a desired diameter. In response to the detected deviations the threshold for the current or capacity measured is modified. By this changes of the current or capacitance values are compensated which rely on changes of the diameter.

BRIEF DESCRIPTION OF THE SEVERAL VIEWS OF THE DRAWINGS

An embodiment for example is subsequently described along the accompanying drawings wherein

FIG. 5 shows a further embodiment of the invention.

DETAILED DESCRIPTION OF THE INVENTION

Figure 1:
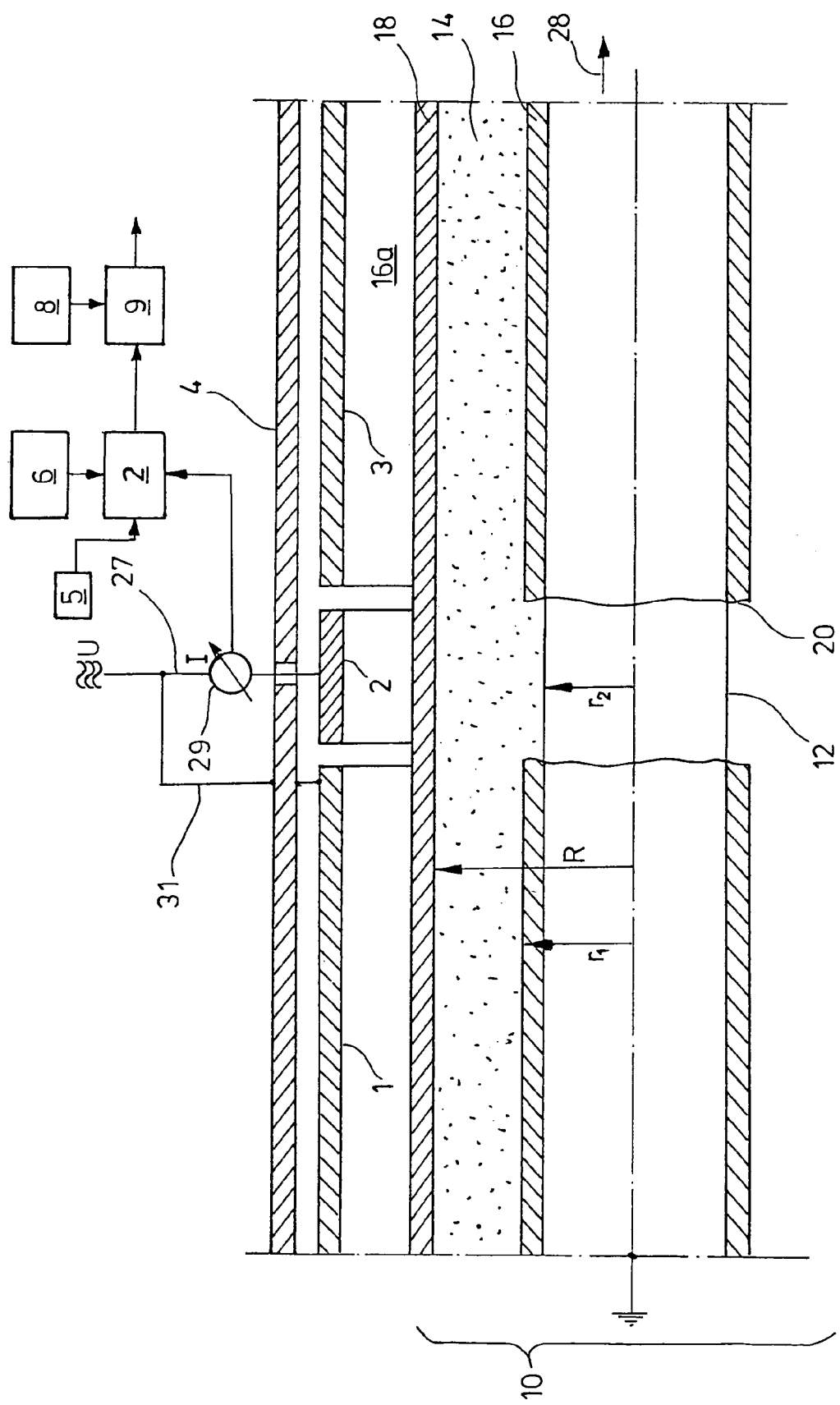
FIG. 1 shows diagrammatically the fundamental structure of a medium or high voltage cable and a device according to the invention.
Figure 2:
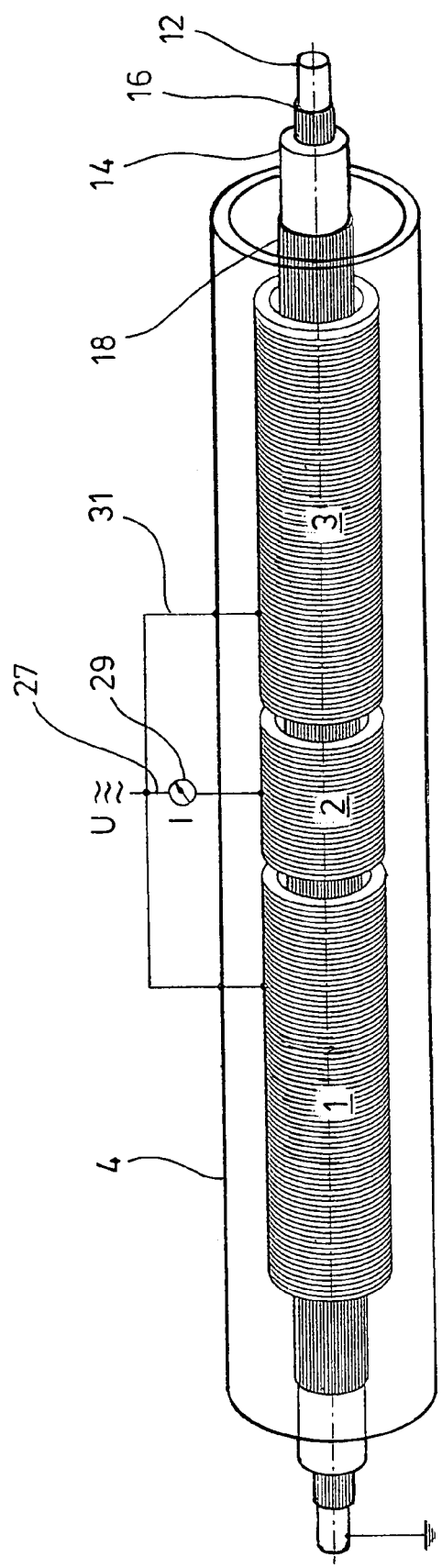
FIG. 2 shows a perspective view of the measuring device according to the invention for a cable of FIG. 1.

While this invention may be embodied in many different forms, there are described in detail herein a specific preferred embodiment of the invention. This description is an exemplification of the principles of the invention and is not intended to limit the invention to the particular embodiment illustrated FIGS. 1 and 2 show a cross-section through a high voltage cable 10 having a conductor e.g. consisting of a plurality of wires. The conductor is surrounded by a semiconducting field smoothing or controlling layer 16, an insulation layer 14 of suitable plastic insulation material and an outer semiconductor layer 18. The layers 16, 18 are shown thicker as normally existing in relation to the remaining dimensions. These layers have semi-conducting properties and a field controlling or field limiting effect.

A cable with a structure described is manufactured by co-extrusion of plastic materials onto the conductor 12. In this connection, it can occur that the layers 16 and/or 18 have interferences or interruptions. An interruption is shown at 20. The shown device is intended to detect such failure.

A cable 10 is moved trough a cylindrical arrangement in the direction of arrow 28, the arrangement being immersed in water 16a. The arrangement includes a cylindrical measuring electrode 2 of relatively short length, e.g. 10 mm which through line 27 is connected to a high frequency voltage source. The high frequency source has for example a frequency of 20 kHz and a voltage of e.g. 20 volts. A current measuring device 29 is connected in line 27 leading to measuring electrode 2.

Adjacent to the ends of measuring electrodes 2, two equipotential electrodes 1, 3 of the same diameter are located defining a small space to the measuring electrode. The length of the equipotential electrodes 1, 3 is for example 30 times of the length of the measuring electrode, i.e. 300mm. Measuring electrode 2 and equipotential electrodes 1, 3 are within a cylindrical screening electrode 4 which is on the same electric potential as electrodes 1 and 3 and is connected to the high frequency source through a line 31. The relatively extended equipotential electrodes 1, 3 coaxial to measuring electrode 2 effect a homogeneous radial electric field within the measuring electrode 2 around cable 10 through the outer semiconductor layer 18 and through the field controlling layer 16.

The arrangement shown can be encircled by an insulation and this by a conducting housing (not shown) which for example is connected to earth as conductor 12. Water 16a has also earth potential outside the measuring device.

The measuring values of the current measuring device are inputted into an evaluation device 2, a threshold generator 5 and a diameter measuring device 6 which measures the outer diameter of the cable are connected to the evaluation device.

Figure 3:
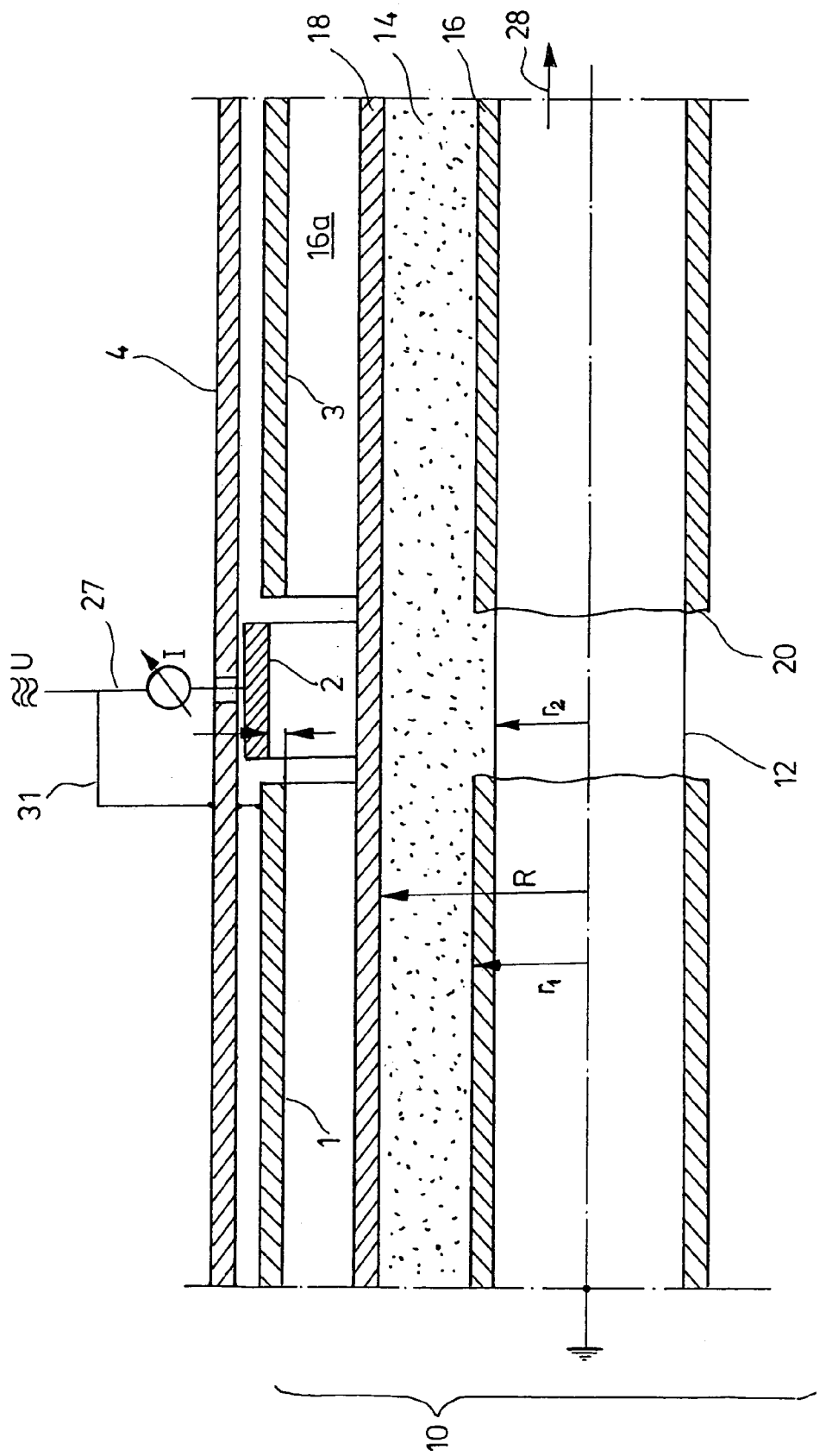
FIG. 3 shows a similar illustration as FIG. 1, however, with a modified measuring electrode.

The parts shown in FIG. 3 are similar to those in FIG. 1 and thus provided with same reference numbers. The single difference is that the measuring electrode 2 has a somewhat larger diameter than the equipotential electrodes 1, 3. By means of this measure a compensation is achieved that at the end of the measuring electrode 2, the radial electric flux lines are deflected laterally and thus, drastically reduce the sensitivity of measuring electrode 2. It is also conceivable to achieve an over-compensation in that the radial flux lines are concentrated towards the conductor which results in a focussing effect. In this case the length of the equipotential electrodes 1 and 3 can be reduced.

Figure 4:
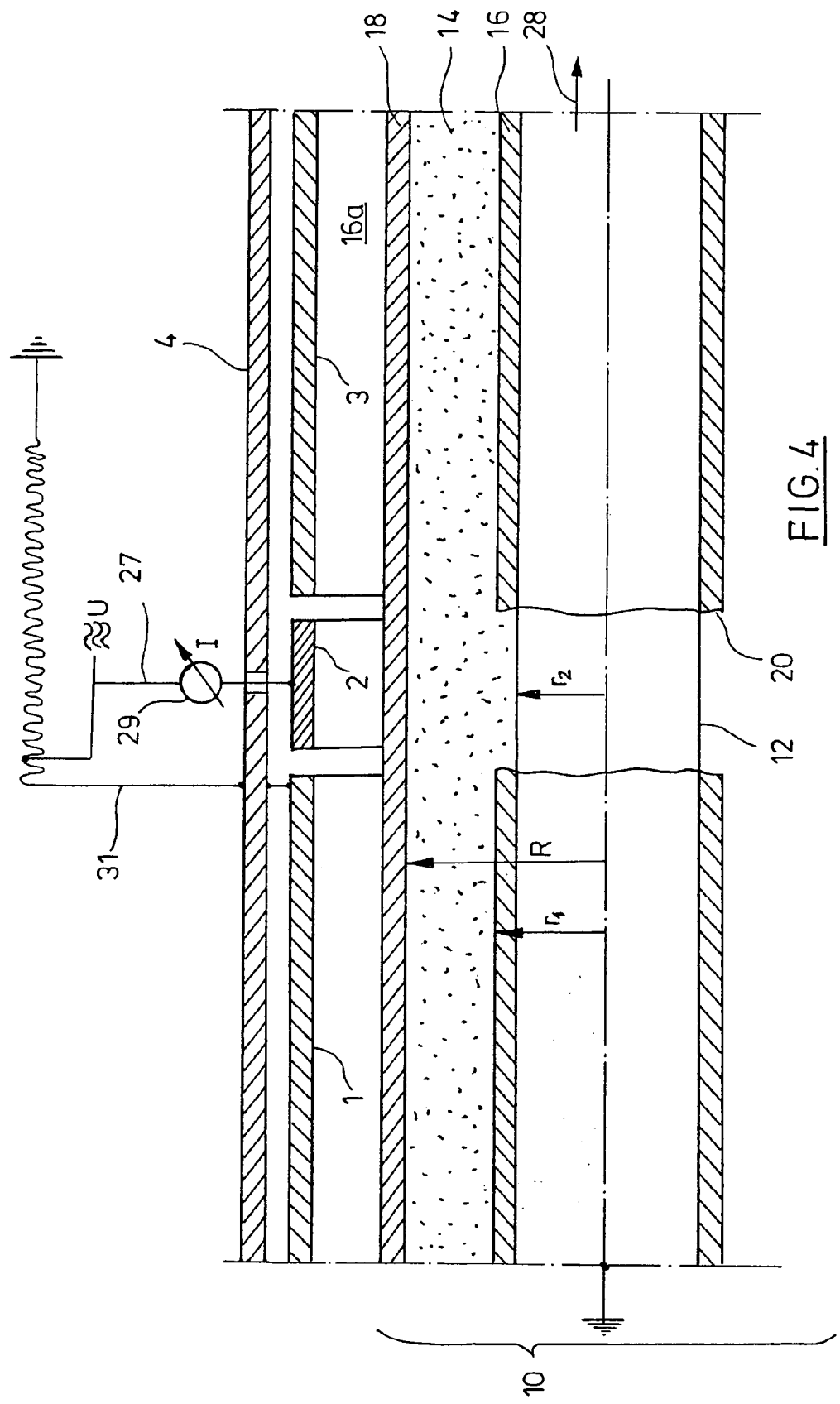
FIG. 4 shows a similar illustration as FIGS. 1 and 3, however, in a somewhat changed structure

The parts in FIG. 4 similar to those of FIG. 1 and 3 are provided with the same reference number. The structure is similar to that of FIG. 1. However, it can be recognized that the equipotential electrodes 1 and 3 and the screening electrode 4 are connected with a voltage which is elevated relative to the voltage at measuring electrode 2. Also in this way an inhomogenity at the measuring electrode is compensated or occasionally over-compensated as already described. The flux lines under the measuring electrode are focussed by this measure and the resolution in longitudinal direction improved.

If the cable 10 is without failures, an essentially constant current I is measured. It is clear that certain changes may occur. Therefore, it is appropriate to first determine a mean value for the current prior to the measurement of failures. As already described, failures may occur by interferences or interruptions of the semiconducting layers 16 and 18 which result in changes of the capacitance and thus in changes of a current. If such a current change is determined by device 2 which change has a predetermined deviation from a mean value or a threshold (threshold generator 5) a failure signal is generated. The failure recognized results for example in the elimination of this cable portion. In order to identify the location of the failure, it is appropriate to measure the length of cable 10 during its longitudinal movement e.g. by a pulse counter. The length measuring device is not shown.

In FIG. 1 a length measuring device 8 is shown measuring the length of the cable which is moved along the measuring position. A failure signal from an evaluation device is transmitted to a second evaluation device which receives also the length signal from the length measuring device 8. On the output of the second evaluation device a signal occurs which indicates a failure of the cable with respect to a certain location thereon.

It has to be added to FIG. 1 that the diameter measuring device 6 may input its signal to a threshold generator 5 in order to modify the threshold in response to the measured diameter.

Water 16a serves as coupling medium and haste effect that the high frequency voltage is immediately connected to the outer layer 18 of cable 10.

It is sufficient to measure the current in the method according to the invention. It is also conceivable to determine the capacitance. However, the capacitance for high voltage cables is no parameter which is measured and a required criterion for such cables.

In FIG. 5 a measuring device is indicated similar to that of FIG. 1 with the cable of FIG. 1 has been omited. The measuring electrode 2 corresponds to that of FIG. 1. The equipotential electrodes 1', 3' differ from those of FIG. 1 such that they are conically formed with the larger diameter being at the end adjacent to measuring electrode 2. By these equipotential electrodes, a focussing of the electric flux lines in the area of measuring electrode 2 is achieved.

Alternatively, the equipotential electrodes 1', 3' could be concave or convex, respectively, comparable with a hollow mirror in order to achieve the desired concentration of the flux lines in the area of measuring electrode 2.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. A device for controlling the manufacture of a medium or high voltage cable having an inner conductor, a sheath of insulating material, an inner field controlling layer between the conductor and the insulating sheath, and an outer semi-conducting layer on the insulating sheath, the individual layers being co-extruded on the conductor, the device comprising a relatively short, cylindrical measuring electrode encircling the cable, a high frequency voltage source connected to the measuring electrode to establish a high frequency voltage between the measuring electrode and the inner field controlling layer and the conductor, respectively, cylindrical equipotential electrodes at both ends of the measuring electrode encircling the cable and connected to the voltage source, the equipotential electrodes having a length which is a multiple of the length of the measuring electrode, the equipotential electrodes and the measuring electrode are dimensioned such and/or the potential of the equipotential electrodes is selected such that in the area of the measuring electrode a substantially homogeneous radial electric field or an electric field with concentrated flux lines between the measuring electrode and the inner field controlling layer or the conductor is generated, the measuring electrode, the equipotential electrodes and the cable being immersed in water, and a measuring device which measures the current between the measuring electrode and the inner field controlling layer or the capacitance of the sheath, and comparing the measured values with a predetermined threshold value and generates a failure signal if owing to an interruption of the inner field controlling layer or the outer semi-conducting layer the measured value for the current or the capacity deviates from the predetermined value a predetermined extent, wherein the proportion of the length of the equipotential electrodes to the length of the measuring electrode is adapted to the proportion of the specific resistance of the outer semi-conducting layer to the resistance of water.

2. A device of claim 1, wherein the outer diameter of the cable is measured and the threshold is modified in dependence of the outer diameter deviating from a predetermined value.

3. The device of claim 1, wherein the length of the equipotential electrodes is 10 to 50 times larger than that of the measuring electrode.

4. The device of claim 1, a wherein the equipotential electrodes and the measuring electrode are encircled by a cylindrical screening electrode which has the same electric potential as the measuring electrode.

5. The device of claim 1, wherein the current measuring device determines the mean value of the measured current values and the threshold corresponds to the mean value or is somewhat smaller than the mean value.

6. The device of claim 1, wherein the cable is associated with a length measuring device, and the measuring device allocates a failure signal to the length value of the cable at the location of the measuring electrode.

7. The device of claim 1, wherein the measuring electrode has a larger diameter than that of the equipotential electrodes.

8. The device of claim 1, wherein the potential of the equipotential electrodes is higher than that of the measuring electrode.

9. The device of claim 1, wherein the equipotential electrodes are conically or concavely shaped with the larger diameter end of the equipotential electrodes being adjacent to the measuring electrode.

* * * * *